United States Patent
Kozasa et al.

(10) Patent No.: US 8,992,791 B2
(45) Date of Patent: Mar. 31, 2015

(54) METHOD OF CLEANING SEMICONDUCTOR WAFER AND SEMICONDUCTOR WAFER

(75) Inventors: Kazuaki Kozasa, Omura (JP);
Tomonori Kawasaki, Omura (JP);
Takahisa Sugiman, Omura (JP);
Hironori Nishimura, Omura (JP)

(73) Assignee: Sumco Techxiv Corporation, Nagasaki (JP)

( * ) Notice: Subject to any disclaimer, the term of this patent is extended or adjusted under 35 U.S.C. 154(b) by 1117 days.

(21) Appl. No.: 12/569,929

(22) Filed: Sep. 30, 2009

(65) Prior Publication Data

US 2010/0093177 A1    Apr. 15, 2010

(30) Foreign Application Priority Data

Oct. 3, 2008 (JP) .................. 2008-258905
Oct. 3, 2008 (JP) .................. 2008-258906

(51) Int. Cl.
*H01L 21/02* (2006.01)

(52) U.S. Cl.
CPC .... *H01L 21/02046* (2013.01); *H01L 21/02052* (2013.01); *H01L 21/02054* (2013.01)
USPC ........................................................ 216/57

(58) Field of Classification Search
USPC ....... 117/106; 134/1, 102.3, 148, 2; 156/345.24; 216/57, 84, 89, 94; 257/347; 438/464, 471, 473, 478, 691, 438/692, 695, 704, 706, 714, 738, 753, 758, 438/778, 9; 451/41; 510/175
See application file for complete search history.

(56) References Cited

U.S. PATENT DOCUMENTS

| | | | |
|---|---|---|---|
| 5,022,961 A | | 6/1991 | Izumi et al. |
| 5,489,557 A | * | 2/1996 | Jolley ............................ 438/476 |
| 5,504,022 A | * | 4/1996 | Nakanishi et al. ............ 438/594 |
| 5,837,662 A | | 11/1998 | Chai et al. |
| 6,492,283 B2 | * | 12/2002 | Raaijmakers et al. ........ 438/770 |
| 7,303,691 B2 | | 12/2007 | Kozasa et al. |
| 2004/0031503 A1 | * | 2/2004 | Eitoku ............................... 134/2 |
| 2007/0059935 A1 | | 3/2007 | Kozasa et al. |
| 2007/0259531 A1 | * | 11/2007 | Stadler et al. ................. 438/704 |
| 2008/0308129 A1 | | 12/2008 | Kozasa et al. |

FOREIGN PATENT DOCUMENTS

| | | |
|---|---|---|
| JP | 5-047741 | 2/1993 |
| JP | 5-275411 | 10/1993 |
| JP | 7-153737 | 6/1995 |
| JP | 2002-509355 | 3/2002 |
| JP | 2006-245301 | 9/2006 |
| JP | 2006-351736 | 12/2006 |

(Continued)

OTHER PUBLICATIONS

Korean Office action that issued with respect to patent family member Korean Patent Application No. 10-2009-0093179 dated Apr. 20, 2011, along with an english translation thereof.

(Continued)

*Primary Examiner* — Duy Deo
*Assistant Examiner* — Erin Bergner
(74) *Attorney, Agent, or Firm* — Greenblum & Bernstein, P.L.C.

(57) ABSTRACT

A silicon wafer surface other than a defect is oxidized by ozone to form a silicon oxide film. A hydrofluoric acid is sprayed and subsequently a cleaning gas is sprayed onto the surface of the silicon wafer.

6 Claims, 9 Drawing Sheets

(56) References Cited

FOREIGN PATENT DOCUMENTS

| JP | 2007-073686 | 3/2007 |
|---|---|---|
| JP | 2008-311568 | 12/2008 |

OTHER PUBLICATIONS

Japan Office action, dated Mar. 26, 2013 along with an english translation thereof.

* cited by examiner

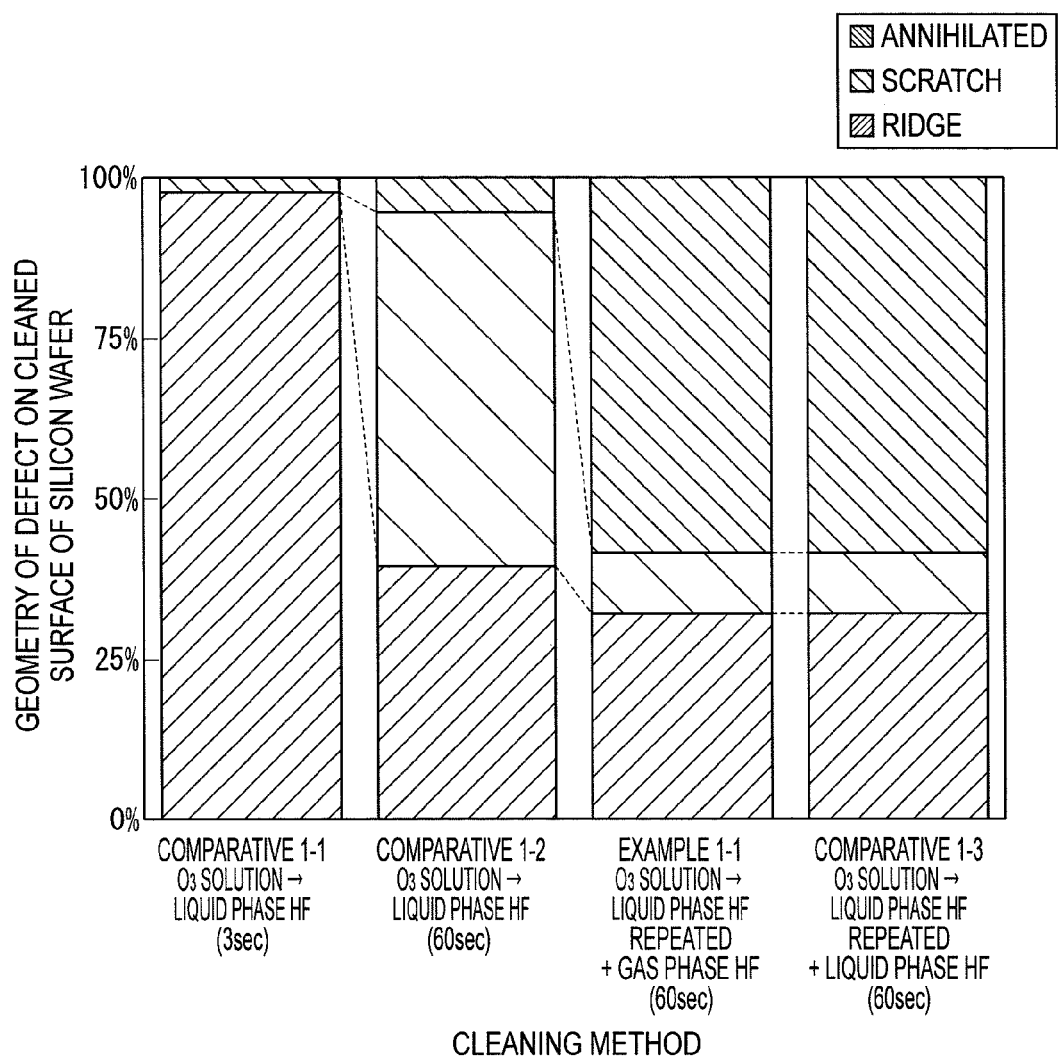

METHOD OF CLEANING SEMICONDUCTOR WAFER AND SEMICONDUCTOR WAFER

The entire disclosure of Japanese Patent Applications No. 2008-258905 filed Oct. 3, 2008, and No. 2008-258906 filed Oct. 3, 2008, are expressly incorporated by reference herein.

BACKGROUND OF THE INVENTION

1. Field of the Invention

The present invention relates to a method for cleaning a semiconductor wafer and a semiconductor wafer.

2. Description of Related Art

A method for polishing a semiconductor silicon wafer using a polishing slurry, which includes a first polishing step, a second polishing step and a final polishing step, has been traditionally known (for example, see Document 1: JP-2007-73686).

Also, a method for cleaning and removing an oxide film by injecting an aqueous solution containing hydrogen fluoride to the oxide film on a surface of a semiconductor silicon wafer to etch the oxide film has been known (for example, see Document 2: JP-2006-351736).

When foreign substances are mixed in a slurry during the slurry polishing as disclosed in Document 1, stress is locally applied on a surface of a semiconductor wafer to alter the crystal structure of silicon (referred to as altered silicon hereinafter), the altered silicon generating a convex defect. Incidentally, an etching rate using hydrogen fluoride of the altered silicon is higher than that of silicon and lower than that of a silicon oxide film.

To remove such a defect, the method as disclosed in Document 2 is used. However, when the oxide film is etched under a condition capable of removing the altered silicon, only the defect of the altered silicon is removed and a large depressed channel is formed on the surface of the semiconductor wafer because the etching rate of the altered silicon is higher than that of silicon as described above.

Further, when hydrofluoric acid is sprayed, the amount of deposits such as particles adhering to the surface of the semiconductor silicon wafer is increased because hydrofluoric acid contains more impurities than the gas containing hydrogen fluoride.

SUMMARY OF THE INVENTION

An object of the invention is to provide a cleaning method of a semiconductor wafer capable of properly removing convex defects caused by stress applied on a surface of the semiconductor wafer when the surface is polished, and to provide a semiconductor wafer.

A cleaning method of a semiconductor wafer according to an aspect of the invention is for removing a convex defect caused by stress applied on a surface of the semiconductor wafer when the surface of the semiconductor wafer is polished, the method including: an oxidation treatment for oxidizing the surface of the semiconductor wafer using liquid containing ozone to form an oxide film on a portion of the surface of the semiconductor wafer except for the defect; a liquid phase etching for dissolving and removing the oxide film by etching using liquid containing hydrogen fluoride; and a gas phase etching for etching the defect using gas containing hydrogen fluoride to dissolve and remove the defect When the surface of the semiconductor wafer is oxidized by ozone and processed by the liquid containing hydrogen fluoride, the defect of altered silicon is not easily etched and the oxide film except for the defect is selectively etched to be dissolved and removed.

When the oxide film except for the defect is etched and the degree of exposure of the defect is increased, an area of contact between the defect and the semiconductor wafer can be reduced to increase an etching rate of the defect. Because silicon is hardly etched by hydrogen fluoride, only the altered silicon is etched. Thus, a smooth surface without asperities can be obtained.

Also, since the surface of the semiconductor wafer is processed by the gas containing hydrogen fluoride in the gas phase etching, the amount of deposits adhering to the surface of the semiconductor wafer can be reduced as compared to when the surface is processed by the liquid phase etching using the liquid containing hydrogen fluoride.

In the above aspect of the invention, the gas phase etching is preferably performed after the oxidation treatment and the liquid phase etching are repeatedly performed.

Since the formation of the oxide film by the ozone solution and the dissolution and removal of the oxide film by the liquid containing hydrogen fluoride are repeated on the surface of the semiconductor wafer, the oxide film having a predetermined thickness can be easily dissolved and removed by properly setting the number of times of such repetition, the concentration of the ozone solution, or the concentration of the liquid containing hydrogen fluoride.

A cleaning method of a semiconductor wafer according to another aspect of the invention is for removing a convex defect caused by stress applied on a surface of the semiconductor wafer when the surface of the semiconductor wafer is polished, the method including: an oxidation treatment for oxidizing the surface of the semiconductor wafer and the defect using gas containing ozone to form an oxide film; and a gas phase etching for etching the surface of the semiconductor wafer using gas containing hydrogen fluoride to dissolve and remove the oxide film.

Since the surface and the defect of the semiconductor wafer are oxidized by the gas containing ozone, ozone of high concentration can be distributed on the surface and the defect of the semiconductor wafer as compared to an oxidation treatment by liquid containing ozone. Thus, the defect and the surface except for the defect of the semiconductor wafer can be oxidized with substantially the same oxidation rate to form the oxide film on the surface of the semiconductor wafer.

Further, the oxidized defect and the oxide film except for the oxidized defect can be dissolved and removed by spraying the gas containing hydrogen fluoride onto the surface of the semiconductor wafer after the oxidation treatment (i.e. etching). Thus, the surface of the semiconductor wafer can be made substantially smooth without defects.

Furthermore, since the surface is cleaned by the oxidation treatment using the gas containing ozone and the gas phase etching using the gas containing hydrogen fluoride, all cleaning process can be performed in gas phase. Thus, the amount of deposits adhering to the surface of the semiconductor wafer can be reduced.

In the above aspect of the invention, the oxide film is preferably dissolved and removed to leave a predetermined thickness of the oxide film on the semiconductor wafer in the gas phase etching.

According to the aspect of the invention, the residual oxide film in the gas phase etching can prevent the exposure of a non-oxidized portion of the semiconductor wafer. Thus, the non-oxidized portion of the semiconductor wafer that is easily affected by deposits is not exposed and consequently deposits are not adhered to the surface of the cleaned semiconductor wafer.

A semiconductor wafer according to still another aspect of the invention is cleaned by the cleaning method of the semiconductor wafer according to one of the above aspects of the invention Since there are very few defects and deposits on the surface of the semiconductor wafer, the semiconductor wafer does not adversely affect device properties.

BRIEF DESCRIPTION OF THE DRAWINGS

FIG. 3 is a graph showing a ratio of various surface textures per unit area on a surface of a cleaned silicon wafer in Example of the first exemplary embodiment.

DETAILED DESCRIPTION OF PREFERRED EMBODIMENT(S)

[First Exemplary Embodiment]

A silicon wafer 1 according to a first exemplary embodiment of the invention will be described below with reference to the accompanying drawings.

Figure 1A:
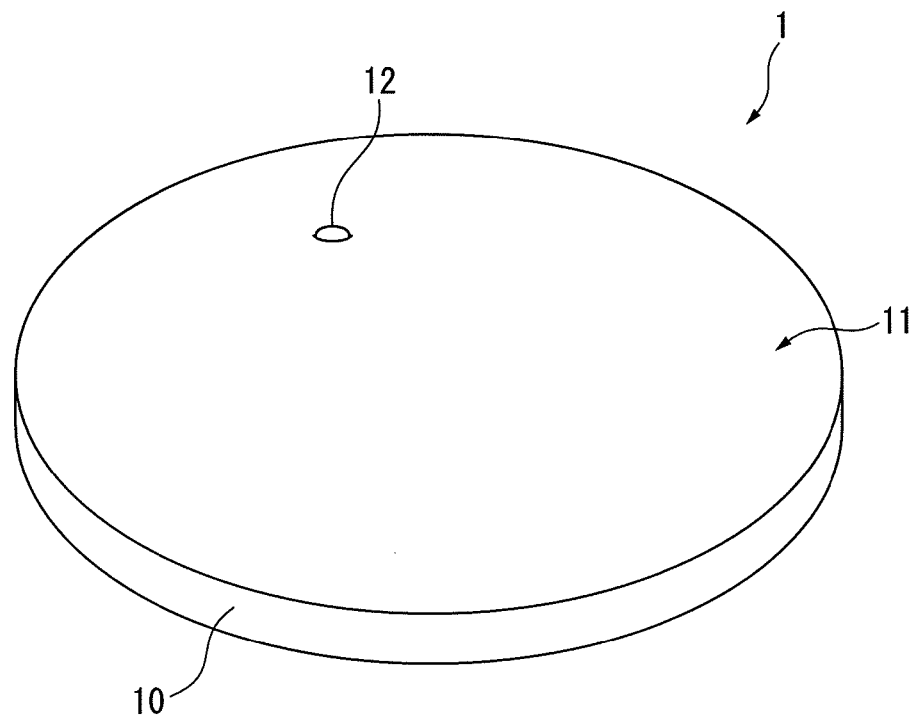
FIG. 1A is a schematic perspective view of a silicon wafer according to first and second exemplary embodiments of the invention.
Figure 1B:
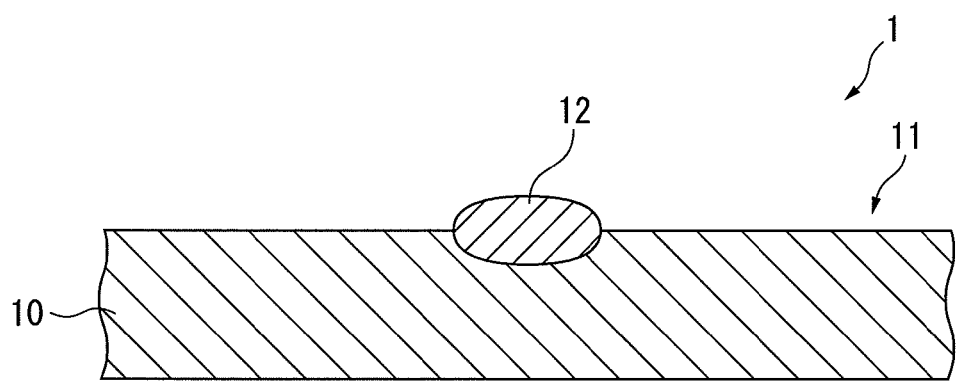
FIG. 1B is a schematic cross-sectional view of the silicon wafer according to the first and second exemplary embodiments of the invention.

FIGS. 1A and 1B schematically show the silicon wafer according to the first exemplary embodiment.

When a silicon wafer surface 11 of the silicon wafer 1 as a semiconductor silicon wafer is polished by a slurry, a defect 12 may be formed. The defect 12 is partially buried in the silicon wafer 1 and is partially projected from the silicon wafer surface 11.

The defect 12 is created by locally concentrated stress on account of foreign substances in the slurry and the like, the stress concentration causing alteration of silicon crystal structure to result in volume expansion of silicon.

In the accompanying drawings, the defect 12 is illustrated in an enlarged manner for facilitating an understanding of the exemplary embodiment.

Figure 2A:
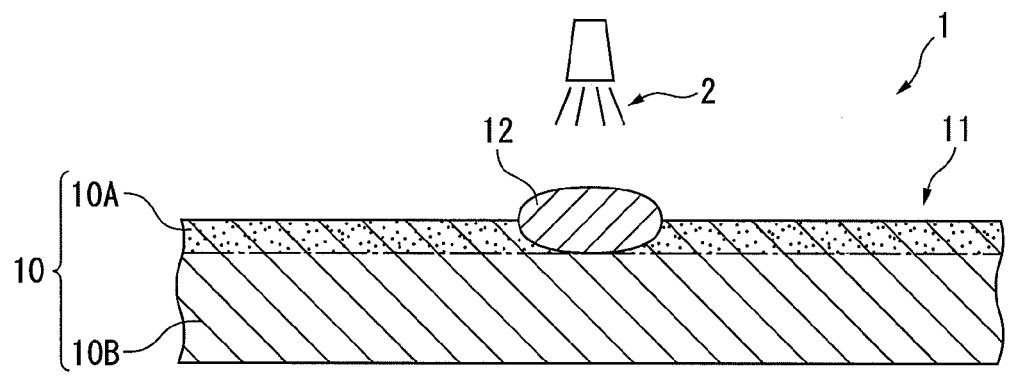
FIG. 2A is a schematic cross-sectional view of the silicon wafer after being subjected to oxidation treatment according to the first exemplary embodiment.
Figure 2B:
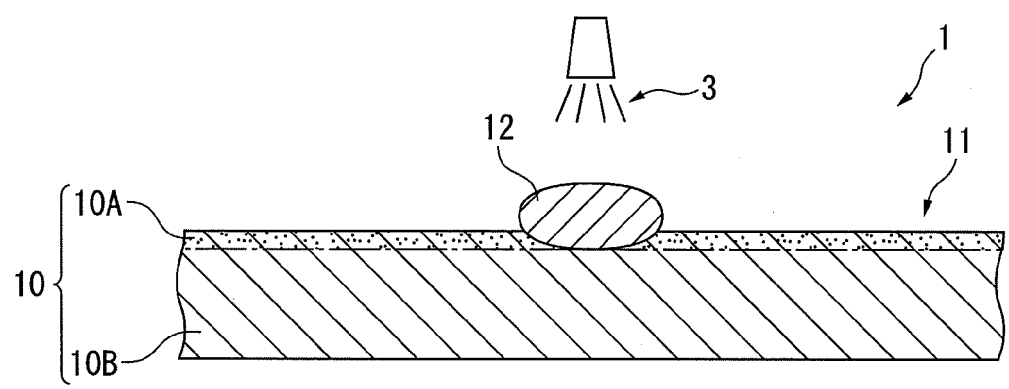
FIG. 2B is a schematic cross-sectional view of the silicon wafer after being subjected to liquid phase etching according to the first exemplary embodiment.
Figure 2C:
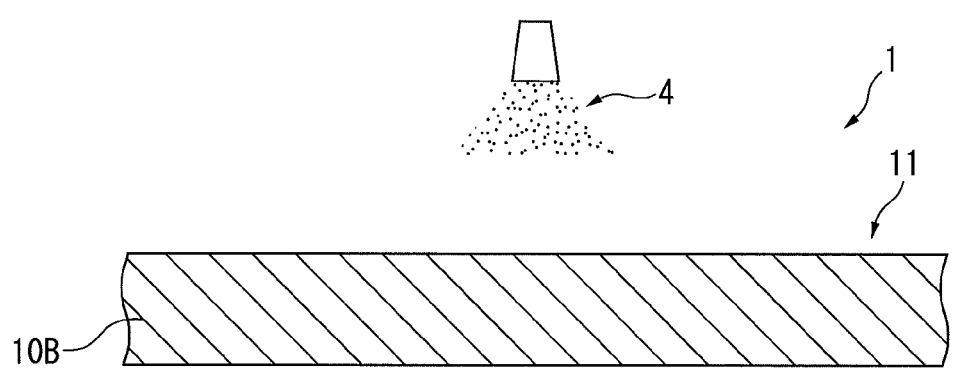
FIG. 2C is a schematic cross-sectional view of the silicon wafer after being subjected to gas phase etching according to the first exemplary embodiment.

A cleaning method of the silicon wafer 1 according to the first exemplary embodiment will be described with reference to FIGS. 2A to 2C. FIGS. 2A to 2C are schematic cross-sectional views showing the silicon wafer subjected to treatments according to the first exemplary embodiment.

(Oxidation Treatment)

As shown in FIG. 2A, an ozone solution 2 (liquid containing ozone) is sprayed onto the silicon wafer 1 for oxidation treatment. Thus, the silicon wafer surface 11 of the silicon wafer 1 is oxidized by ozone to form a silicon oxide film 10A. At this time, the defect 12 made of altered silicon is hardly oxidized by the ozone solution 2. Accordingly, a portion except for the defect 12 becomes the silicon oxide film 10A. Incidentally, the silicon wafer 1 other than the silicon oxide film 10A is referred to as a non-oxide silicon substrate 10B.

(Liquid Phase Etching)

As shown in FIG. 2B, in liquid phase etching, a hydrofluoric acid 3 (liquid containing hydrogen fluoride) is sprayed onto the silicon oxide film 10A to dissolve and remove the silicon oxide film 10A having a predetermined thickness (i.e. by etching).

After the silicon wafer 1 is etched, the ozone solution 2 is sprayed again to form the silicon oxide film 10A and the hydrofluoric acid 3 is sprayed to etch the silicon oxide film 10A. Such a formation and etching of the silicon oxide film 10A are repeated until the silicon oxide film 10A having a predetermined thickness is dissolved and removed by the etching. The hydrofluoric acid may be sprayed only once to dissolve and remove the silicon oxide film 10A having a predetermined thickness.

An etching rate using the hydrofluoric acid 3 of the silicon oxide film 10A is high and an etching rate using the hydrofluoric acid 3 of the defect 12 is low. Accordingly, while the silicon oxide film 10A is favorably dissolved and removed by the etching using the hydrofluoric acid 3, the defect 12 is hardly etched but remains on the silicon wafer surface 11.

In other words, the silicon oxide film 10A is selectively dissolved and removed by the oxidation treatment and etching and thus the defect 12 is prominently projected from the silicon wafer surface 11 to be exposed.

(Gas Phase Etching)

As shown in FIG. 2C, in gas phase etching, a cleaning gas 4 (gas containing nitrogen gas and hydrogen fluoride vaporized) is sprayed onto the silicon wafer surface 11. Accordingly, the defect 12 and the silicon oxide film 10A of the silicon wafer surface 11 are dissolved and removed by etching.

Since the degree of exposure of the defect 12 is increased by the liquid phase etching, the etching rate of the defect 12 in the gas phase etching is increased. When the etching is performed until the defect 12 is completely dissolved and removed, the silicon oxide film 10A is completely dissolved and removed and consequently the non-oxide silicon substrate 10B is exposed on the surface.

In the gas phase etching, only the silicon oxide film 10A and the defect 12 are dissolved and removed because the non-oxide silicon substrate 10B is hardly etched by the cleaning gas.

The non-oxide silicon substrate 10B that is easily affected by deposits is exposed on the silicon wafer surface 11. However, because the gas phase etching produces very few deposits, deposits are hardly adhered to the silicon wafer surface 11.

Thus, after undergoing the gas phase etching, the silicon wafer 1 has a smooth surface to which few deposits are adhered and on which the non-oxide silicon substrate 10B is exposed.

(Advantages of First Exemplary Embodiment)
(1) The silicon wafer surface 11 other than the defect 12 is oxidized by ozone to form the silicon oxide film 10A. Then, the hydrofluoric acid 3 is sprayed onto the silicon wafer surface 11.

Only the silicon oxide film 10A having a higher etching rate than the defect 12 can be selectively etched to be dissolved and removed by the hydrofluoric acid 3. Consequently, the defect 12 is more prominently exposed to increase the etching rate of the defect 12.

Subsequently, by spraying the cleaning gas 4 onto the surface of the silicon wafer 1, the silicon oxide film 10A is dissolved and removed while the defect 12 is dissolved and removed by etching. Thus, the surface of the silicon wafer 1 can be made substantially smooth without defects.

Though the non-oxide silicon substrate 10B is easily contaminated by deposits such as metal, the gas phase etching using the cleaning gas 4 contributes to prevent the non-oxide silicon substrate 10B from being contaminated by deposits as compared to the liquid phase etching using the hydrofluoric acid 3.

(2) By repeating the formation of the silicon oxide film 10A using the ozone solution 2 and the dissolution and removal of the silicon oxide film 10A using the hydrofluoric acid 3 on the silicon wafer surface 11 at appropriate times, the silicon oxide film 10A having a predetermined thickness can be easily dissolved and removed.

(3) Since the silicon wafer surface 11 of the silicon wafer 1 is substantially smooth with very few deposits, device properties are not easily adversely affected.

(Example(s) of First Exemplary Embodiment)
Examples and Comparatives will be described below to explain the advantages of the first exemplary embodiment.

EXPERIMENTAL PROCEDURE

Comparative 1-1

The oxidation treatment was performed by dropping the ozone solution 2 of 15 ppm concentration at 23 degrees C. onto the silicon wafer surface 11 with a flow rate of 1 liter per minute for 15 seconds.

The liquid phase etching was performed by dropping the hydrofluoric acid 3 of 1 mass % concentration at 23 degrees C. onto the silicon wafer surface 11 with a flow rate of 1 liter per minute for 3 seconds.

Comparative 1-2

The oxidation treatment was performed in the same manner as in Comparative 1-1.
The liquid phase etching was performed by dropping the hydrofluoric acid 3 of 1 mass % concentration at 23 degrees C. onto the silicon wafer surface 11 with a flow rate of 1 liter per minute for 60 seconds.

Comparative 1-3

The oxidation treatment and the liquid phase etching (dropping for 3 seconds) as in Comparative 1-1 were repeatedly performed.
Subsequently, the liquid phase etching (dropping for 60 seconds) was performed in the same manner as in Comparative 1-2.

Example 1-1

The oxidation treatment and the liquid phase etching as in Comparative 1-1 were repeatedly performed.
Subsequently, the gas phase etching was performed by spraying the cleaning gas 4 as nitrogen gas mixed with hydrogen fluoride of 23 $g/m^3$ concentration onto the silicon wafer surface 11 for 60 seconds under an injection pressure of 101 kPa.

Experimental Results

FIG. 3 shows a ratio of surface textures per unit area on the cleaned silicon wafer surface.

In FIG. 3, "ridge" means the defect 12 made of altered silicon of the silicon wafer surface 11, "scratch" means a concavity formed by etching the defect 12 of the silicon wafer surface 11, and "disappearance" means a substantially smooth surface.

A vertical axis represents a ratio of numbers of ridges, scratches and disappearances changed from the ridges when the number of the ridges right after polishing is 100%. A horizontal axis represents cleaning methods according to Comparative 1-1, Comparative 1-2, Example 1-1 and Comparative 1-3.

In Comparative 1-1, approximately 98% of the ridges remained as the ridges.

In Comparative 1-2, time for liquid phase etching was extended from 3 seconds to 60 seconds. Accordingly, the defect 12 was dissolved and the ridges changed into the scratches. Consequently, the ridges accounted for approximately 35% and the scratches accounted for approximately 60% in Comparative 1-2.

In Example 1-1, the ridges were exposed by repeating the oxidation treatment and the liquid phase etching as in Comparative 1-1. Further, the exposed defect 12 was dissolved and removed by performing the gas phase etching for 60 seconds. Consequently, the ratio of the ridges was decreased to approximately 30% while the disappearances accounted for approximately 60%.

In Comparative 1-3, the ridges were exposed and the defect 12 was dissolved and removed by repeating the oxidation treatment and the liquid phase etching as in Comparative 1-1 and then performing the liquid phase etching for 60 seconds as in Comparative 1-2. Consequently, the ratio of the ridges was decreased to approximately 30% while the disappearances accounted for approximately 60% as in Example 1-1.

Thus, it was found that the ridges (defects) on the silicon wafer surface 11 were removed and most of the ridges became substantially smooth (disappearance) by the cleaning methods according to Example 1-1 and Comparative 1-3.

Figure 4:
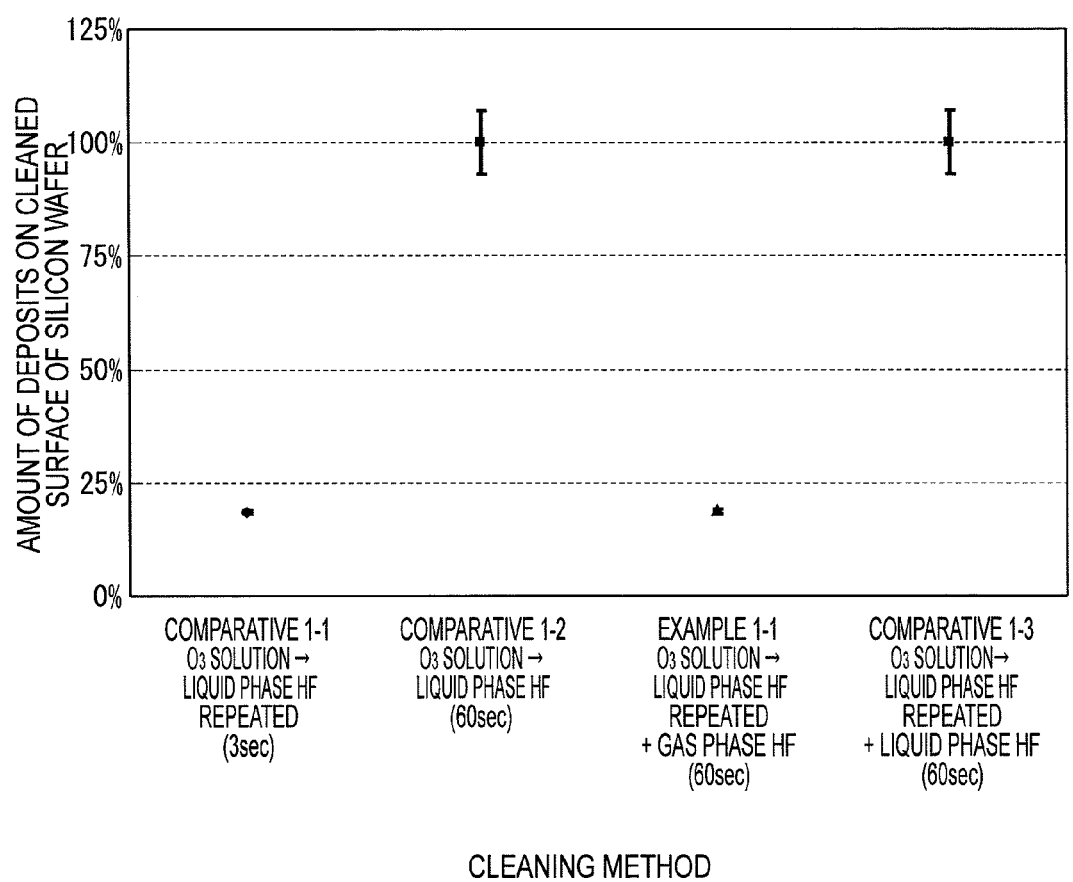
FIG. 4 is a graph showing a relative ratio of an amount of deposits adhering to the surface of the cleaned silicon wafer in Example of the first exemplary embodiment.

FIG. 4 shows a relative ratio of deposits adhering to the cleaned silicon wafer surface.

In FIG. 4, a vertical axis represents a ratio of deposits (such as metal particles) when the amount of deposits adhering to the silicon wafer surface 11 cleaned by the cleaning method according to Comparative 1-2 is 100%.

As understood from FIG. 4, the amount of the deposits was large in Comparative 1-3 as in Comparative 1-2. In Comparative 1-1 and Example 1-1, the amount of the deposits was 20% or less of that in Comparative 1-2. Accordingly, it was found that the amount of the deposits was increased when the liquid phase etching was performed for a long time.

Thus, it was found that the gas phase etching was more preferable than the liquid phase etching for cleaning the silicon wafer 1.

Figure 5A:
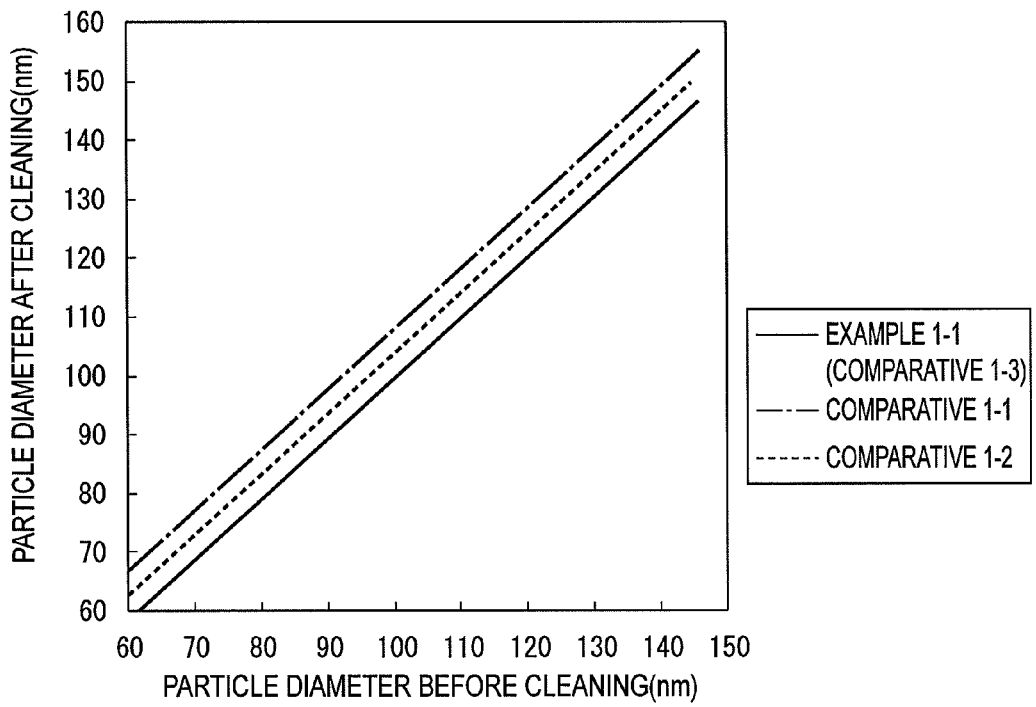
FIG. 5A is a graph showing a particle diameter of a defect before and after cleaning when the particle diameter of the defect before cleaning is 60 nm or more in Example of the first exemplary embodiment.
Figure 5B:
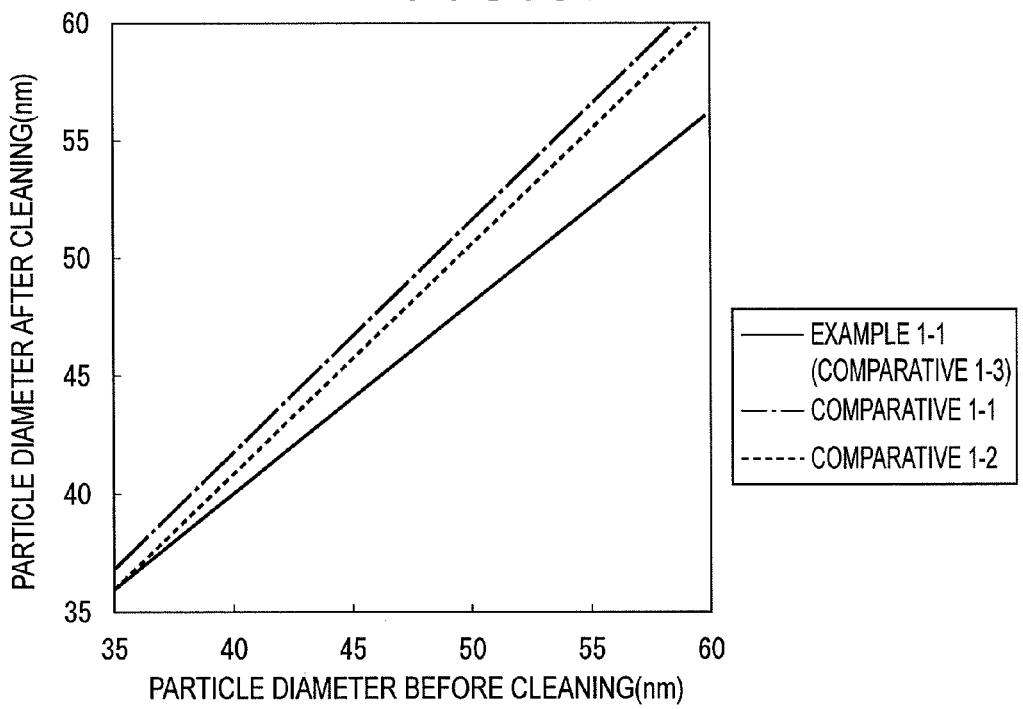
FIG. 5B is a graph showing a particle diameter of a defect before and after cleaning when a particle diameter of a defect before cleaning is 35 to 60 nm in Example of the first exemplary embodiment.

FIG. 5A shows a particle diameter of a cleaned defect when a particle diameter of an uncleaned defect is 60 nm or more. FIG. 5B shows a particle diameter of a cleaned defect when a particle diameter of an uncleaned defect is 35 to 60 nm.

In FIGS. 5A and 5B, a vertical axis represents the particle diameter of the uncleaned defect and a horizontal axis represents the particle diameter of the cleaned defect.

As understood from FIGS. 5A and 5B, the particle diameter of the cleaned defect was reduced in the order of Example 1-1 (Comparative 1-3), Comparative 1-2 and Comparative 1-1. Accordingly, a capability for removing or diminishing the defect was high in the order of Example 1-1 (Comparative 1-3), Comparative 1-2 and Comparative 1-1. Thus, it was found that the cleaning method according to Example 1-1 was most preferable in terms of the amount of the deposits and the removal of the defect.

[Second Exemplary Embodiment]

Next, the silicon wafer 1 according to a second exemplary embodiment of the invention will be described below.

It should be noted that the same components as those in the first exemplary embodiment are designated with the same reference numerals and the description thereof will be omitted or simplified.

FIGS. 1A and 1B schematically show the silicon wafer according to the second exemplary embodiment.

Figure 6A:
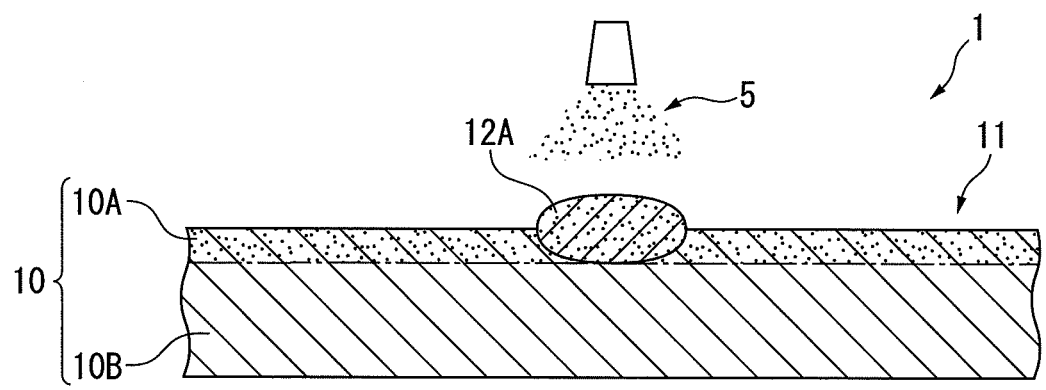
FIG. 6A is a schematic cross-sectional view of a silicon wafer after being subjected to oxidation treatment according to the second exemplary embodiment.
Figure 6B:
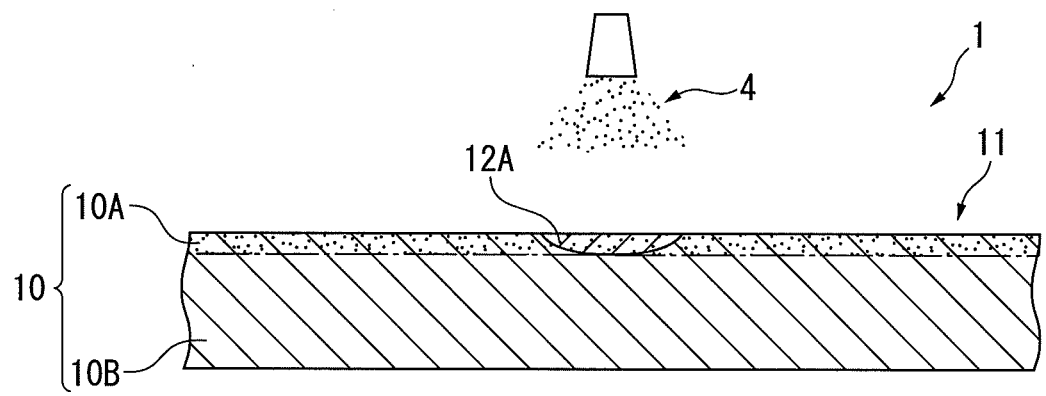
FIG. 6B is a schematic cross-sectional view of the silicon wafer after being subjected to gas phase etching according to the second exemplary embodiment.

A cleaning method of the silicon wafer 1 according to the second exemplary embodiment will be explained with reference to FIGS. 6A and 6B. FIGS. 6A and 6B schematically show the silicon wafer subjected to treatments according to the second exemplary embodiment.

(Oxidation Treatment)

As shown in FIG. 6A, the ozone gas 5 (gas containing ozone) is sprayed onto the silicon wafer 1 for the oxidation treatment. Accordingly, the silicon wafer surface 11 of the silicon wafer 1 is oxidized by ozone to form the silicon oxide film 10A. Because the ozone gas 5 can be prepared in a higher concentration than an ozone solution, oxidation power is stronger in the oxidation treatment using the ozone gas 5 than in the oxidation treatment using the ozone solution. Thus, the defect 12, which is not oxidized by the ozone solution, is oxidized and becomes an oxidation defect 12A. Incidentally, the silicon wafer 1 other than the silicon oxide film 10A is referred to as the non-oxide silicon substrate 10B.

(Gas Phase Etching)

As shown in FIG. 6B, the gas phase etching is performed by spraying the cleaning gas 4 (gas containing hydrogen fluoride) onto the silicon wafer surface 11 after the oxidation treatment. Accordingly, the oxidation defect 12A and the silicon oxide film 10A are simultaneously etched.

Because the etching rate of the oxidation defect 12A is slightly higher than that of the silicon oxide film 10A, the oxidation defect 12A is etched larger than the silicon oxide film 10A and is dissolved and removed. The oxidation defect 12A that has a convex shape becomes substantially smooth like the planar silicon oxide film 10A and thus the whole silicon wafer surface 11 becomes substantially smooth.

Incidentally, it is preferable that the oxidation defect 12A and the silicon oxide film 10A are not completely etched so that the non-oxidation silicon substrate 10B is not exposed. When the non-oxidization substrate 10B that is easily affected by deposits is not exposed, the amount of deposits after cleaning can be reduced.

(Advantages of Second Exemplary Embodiment)

(4) Since the ozone gas 5 containing ozone is sprayed onto the silicon wafer 1 in the oxidation treatment, ozone having higher concentration can be distributed on the silicon wafer surface 11 than the case where an ozone solution is sprayed.

Thus, the defect 12 that is not oxidized by the ozone solution can be oxidized by the ozone gas 5 to transform the defect 12 into the oxidation defect 12A.

Also, the oxidation treatment in gas phase using the ozone gas 5 contributes to reduce the contamination of the silicon wafer by deposits as compared to the oxidation treatment using the ozone solution in liquid phase.

The gas phase etching is performed by injecting the cleaning gas 4. At this time, the etching rate of the oxidation defect 12A is slightly higher than that of the silicon oxide film 10A and therefore the oxidation defect 12A is etched larger than the silicon oxide film 10A to be dissolved and removed. Accordingly, the oxidation defect 12A that has a convex shape becomes substantially smooth like the planar silicon oxide film 10A. Thus, the whole silicon wafer surface 11 becomes substantially smooth.

Further, owing to the gas phase etching using the cleaning gas 4, the silicon wafer is less contaminated by deposits than by the liquid phase etching using hydrofluoric acid.

(5) Since the oxidation defect 12A and the silicon oxide film 10A remain to have a slight thickness in the gas phase etching, the exposure of the non-oxidization silicon substrate 10B can be prevented. Thus, the non-oxidization silicon substrate 10B that is easily affected by deposits is not exposed and therefore deposits are not adhered to the silicon wafer surface 11 after cleaning.

(6) The silicon wafer surface 11 is oxidatively-treated by the ozone gas 5 in gas phase, and then is etched by the cleaning gas 4 in gas phase. Accordingly, the silicon wafer surface 11 is not cleaned in liquid phase. Thus, the silicon wafer surface 11 can be cleaned with very few deposits.

(7) Since the silicon wafer surface 11 of the silicon wafer 1 of the second exemplary embodiment is substantially smooth with very few deposits, device properties are not adversely affected as described in the advantage (3) of the first exemplary embodiment.

(Example(s) of Second Exemplary Embodiment)

Examples and Comparatives will be described below to explain the advantages of the second exemplary embodiment.

EXPERIMENTAL PROCEDURE

Comparative 2-1

The oxidation treatment was performed by spraying an ozone solution of 15 ppm concentration at 23 degrees C. onto the silicon wafer surface 11 with a flow rate of 1 liter per minute for 15 seconds.

Then, the liquid phase etching was performed by spraying a hydrofluoric acid of 1 mass % concentration at 23 degrees C. onto the silicon wafer surface 11 with a flow rate of 1 liter per minute for 3 seconds.

Comparative 2-2

The oxidation treatment was performed in the same manner as in Comparative 2-1.

The liquid phase etching was performed by spraying a hydrofluoric acid of 1 mass % concentration onto the silicon wafer surface 11 with a flow rate of 1 liter per minute at 23 degrees C. for 60 seconds.

Comparative 2-3

The oxidation treatment was performed by spraying the ozone gas 5 of 120 mg/m$^3$ concentration at 23 degrees C. onto the silicon wafer surface 11 for 40 seconds under an injection pressure of 106 kPa.

The liquid phase etching was performed in the same manner as in Comparative 2-2.

Example 2-1

The oxidation treatment was performed in the same manner as in Comparative 2-3.

The gas phase etching was performed by spraying the cleaning gas 4 (nitrogen gas mixed with hydrogen fluoride of 23 g/m$^3$ concentration) onto the silicon wafer surface 11 for 60 seconds under an injection pressure of 101 kPa.

Experimental Results

Figure 7:
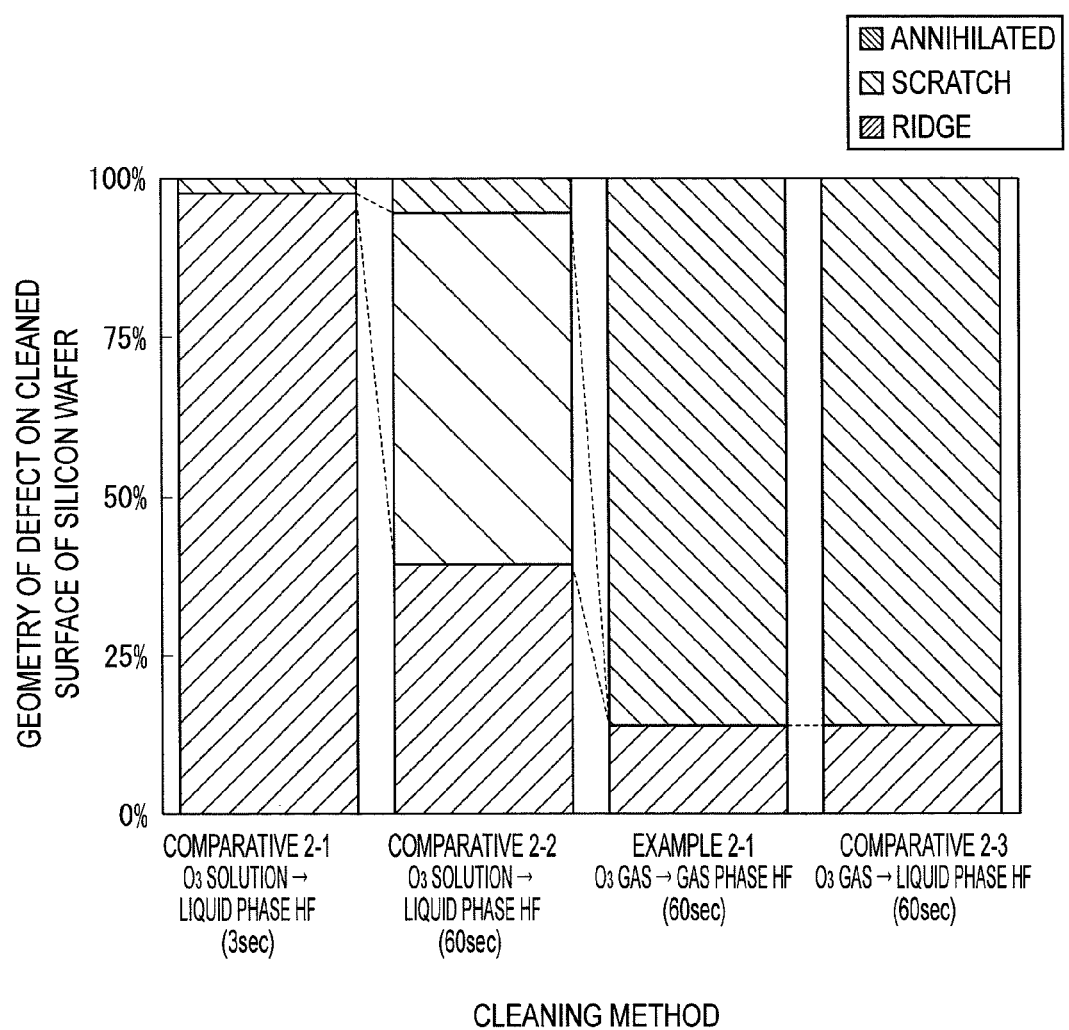
FIG. 7 is a graph showing a ratio of various surface textures per unit area on a surface of a cleaned silicon wafer in Example of the second exemplary embodiment.

FIG. 7 shows a ratio of surface textures per unit area on the cleaned silicon wafer surface.

In FIG. 7, "ridge" means the defect 12 made of altered silicon of the silicon wafer surface 11, "scratch" means a concavity formed by etching the defect 12 of the silicon wafer surface 11, and "disappearance" means a substantially smooth surface.

A vertical axis represents a ratio of numbers of ridges, scratches and disappearances changed from the ridges when the number of the ridges just after polishing is 100%. A horizontal axis represents cleaning methods according to Comparative 2-1, Comparative 2-2, Example 2-1 and Comparative 2-3.

In Comparative 2-1, approximately 98% of the ridges remained as the ridges.

In Comparative 2-2, the defect 12 became concave and the ridges changed into the scratches because time for liquid phase etching was extended from 3 seconds to 60 seconds. Consequently, the ridges accounted for approximately 35% and the scratches accounted for approximately 60% in Comparative 2-2.

In Example 2-1, the silicon wafer surface 11 was oxidatively-treated by the ozone gas 5 to form the silicon oxide film 10A and the oxidation defect 12A as in Comparative 2-1. Subsequently, the gas phase etching was further performed for 60 seconds to dissolve and remove the silicon oxide film 10A and the oxidation defect 12A by etching. Consequently, the ridges did not change into the scratches but changed into disappearances.

In Comparative 2-3, the silicon wafer surface 11 was oxidatively-treated by the ozone gas 5 having high concentration to form the silicon oxide film 10A and the oxidation defect 12A. Subsequently, the liquid phase etching was performed for 60 seconds as in Comparative 2-2 to dissolve and remove the silicon oxide film 10A and the oxidation defect 12A by etching. Consequently, most of the ridges changed into the disappearances.

Thus, it was found that the ridges on the silicon wafer surface 11 were removed and most of the ridges became substantially smooth by the cleaning methods according to Example 2-1 and Comparative 2-3.

Figure 8:
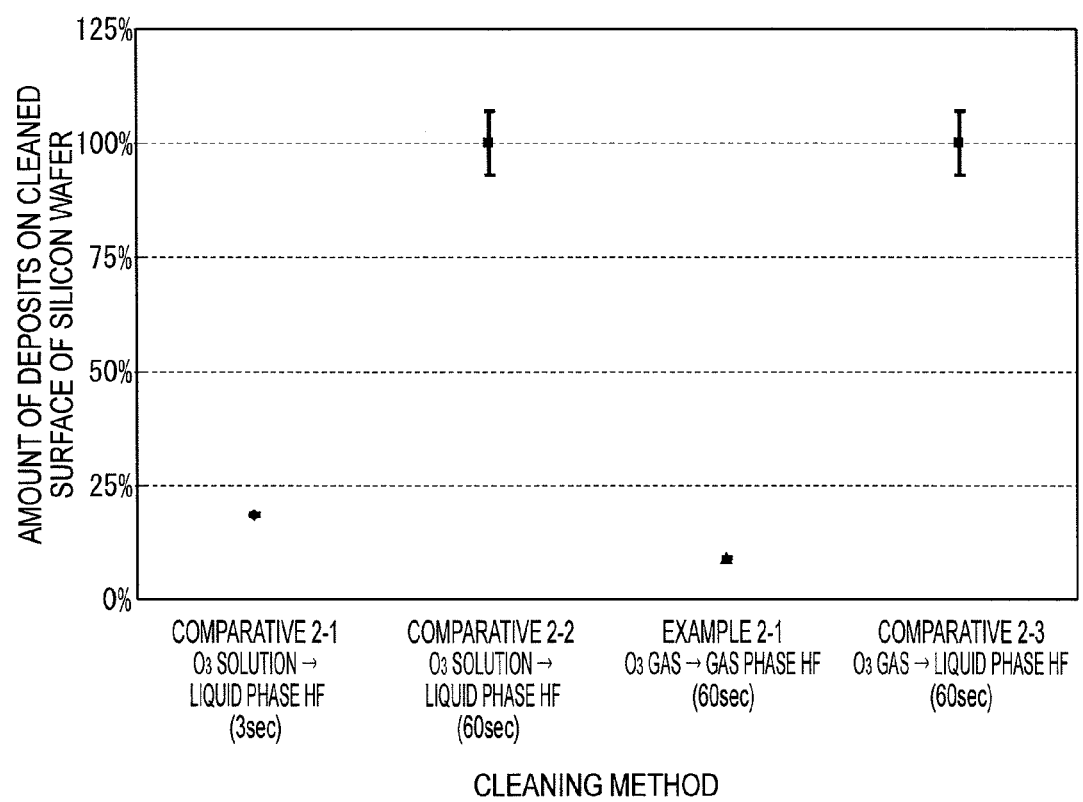
FIG. 8 is a graph showing a relative ratio of an amount of deposits adhering to the surface of the cleaned silicon wafer in Example of the second exemplary embodiment.

FIG. 8 shows a relative ratio of deposits adhering to the cleaned silicon wafer surface.

In FIG. 8, a vertical axis represents a ratio of deposits (such as metal particles) when the amount of deposits adhering to the silicon wafer surface 11 cleaned by the cleaning method according to Comparative 2-2 is 100%.

As understood from FIG. 8, the amount of deposits in Comparative 2-1 was 20% or less of that in Comparative 2-2. Accordingly, it was found that the amount of the deposits was increased when the liquid phase etching was performed for a long time.

In Comparative 2-3, the amount of deposits was substantially the same as in Comparative 2-2. Thus, it was found that the amount of deposits considerably depended on time for the liquid phase etching.

On the other hand, in Example 2-1, the amount of deposits was extremely small and was approximately 9% of that in Comparative 2-2 because the oxidation treatment and the gas phase etching were performed in gas phase.

Thus, it was found that the gas phase etching was more preferable than the liquid phase etching for cleaning the silicon wafer 1.

Figure 9A:
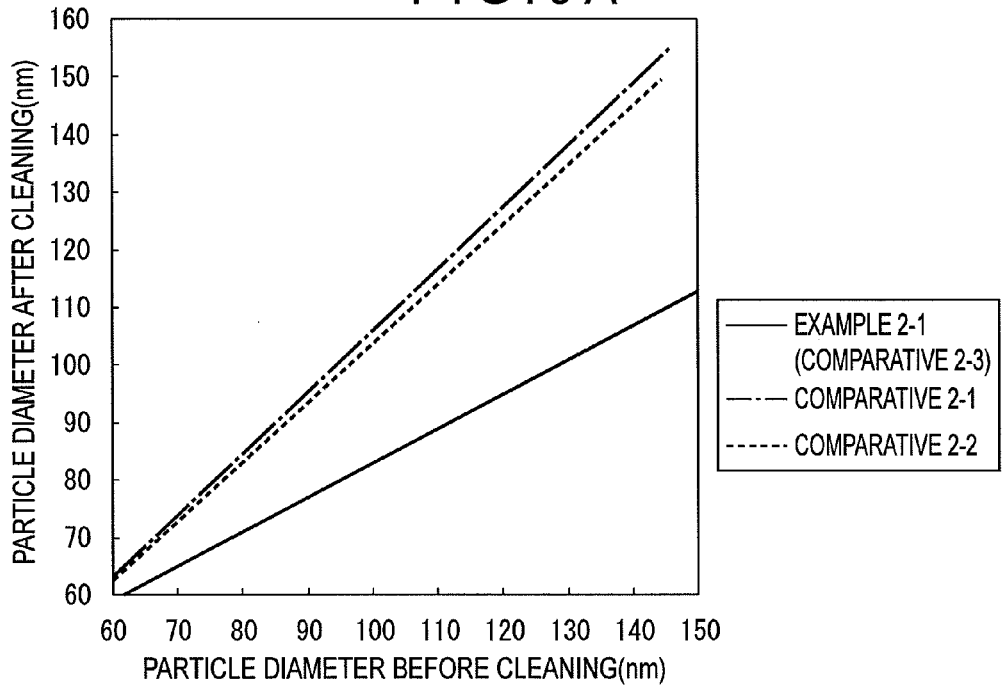
FIG. 9A is a graph showing a particle diameter of a defect before and after cleaning when a particle diameter of a defect before cleaning is 60 nm or more in Example of the second exemplary embodiment.
Figure 9B:
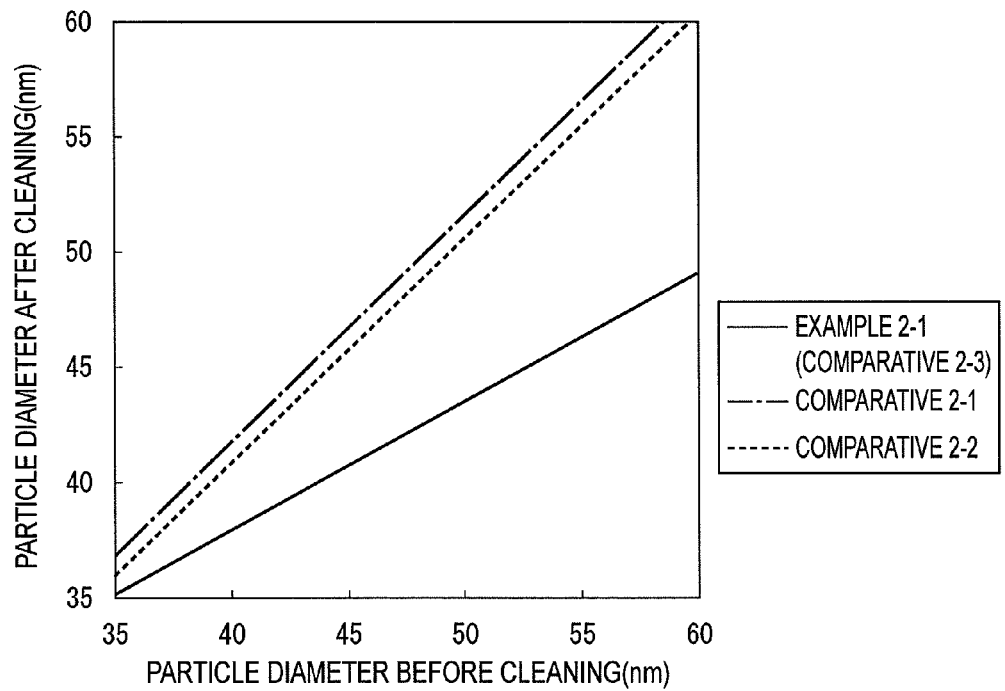
FIG. 9B is a graph showing a particle diameter of a defect before and after cleaning when the particle diameter of the defect before cleaning is 35 to 60 nm in Example of the second exemplary embodiment.

FIG. 9A shows a particle diameter of a cleaned defect when a particle diameter of a defect before and after cleaning is 60 nm or more. FIG. 9B shows a particle diameter of a cleaned defect when a particle diameter of a defect before and after cleaning is 35 to 60 nm.

In FIGS. 9A and 9B, a vertical axis represents the particle diameter of the uncleaned defect and a horizontal axis represents the particle diameter of the cleaned defect.

As understood from FIGS. 9A and 9B, the particle diameter of the cleaned defect was reduced in the order of Example 2-1 (Comparative 2-3), Comparative 2-2 and Comparative 2-1. Accordingly, a capability for removing or diminishing the defect was high in the order of Example 2-1 (Comparative 2-3), Comparative 2-2 and Comparative 2-1.

Since the particle diameter was considerably reduced in Example 2-1 (Comparative 2-3) as compared to Comparatives 2-1 and 2-2, it was found that the cleaning method according to Example 2-1 (Comparative 2-3) had an excellent capability for removing the defect.

Thus, it was found that the cleaning method according to Example 2-1 was the most preferable in terms of the amount of the deposits and the removal of the defect.

(Modification(s) of Exemplary Embodiment(s))

The invention is not limited to the first and second exemplary embodiments as described above, but includes various improvements and modifications as long as an object of the invention can be achieved.

Though the ozone solution 2 and the hydrofluoric acid 3 are sprayed onto the silicon wafer surface 11 in the first exemplary embodiment, the silicon wafer surface 11 may be dipped into the ozone solution 2 and the hydrofluoric acid 3.

Though the ozone solution 2 and the hydrofluoric acid 3 are repeatedly sprayed in the first exemplary embodiment, a cleaning liquid containing ammonia and hydrogen peroxide solution may be sprayed.

Though the oxidation treatment is performed by the ozone gas 5 in the second exemplary embodiment, other gas may be used as long as the oxidation defect 12A and the silicon oxide film 10A are formed.

Though the etching is performed by the cleaning gas 4 containing hydrogen fluoride in the second exemplary embodiment, other gas may be used as long as the oxidation defect 12A and the silicon oxide film 10A are etched and the oxidation defect 12A has a slightly higher etching rate than the silicon oxide film 10A.

It should be noted that, although the best arrangement for carrying out the invention has been described in the above description, the invention is not limited thereto. While the invention has been particularly illustrated and described with reference to the specific embodiments, those skilled in the art can modify the above-described shapes, materials, quantities and other details without departing from the spirit and scope of the invention.

Specifically, a shape, material and the like described above merely serve as exemplification for facilitating an understanding of the invention, and do not serve as any limitations on the invention, so that what is described by a name of a component for which the description of the shape, material and the like are partially or totally removed is also within the scope of the invention.

What is claimed is:

1. A cleaning method of a semiconductor wafer for removing a convex defect caused on a surface of a semiconductor wafer by a volume expansion due to an alteration of a crystal structure of a part of the surface of the semiconductor at which a local stress is applied by a foreign substance in a slurry when the surface of the semiconductor wafer is polished with the slurry, the method comprising:
    an oxidation treatment for applying liquid containing ozone on the surface of the semiconductor wafer to oxidize the surface of the semiconductor wafer and a part of the convex defect formed on the surface of the semiconductor wafer to form an oxide film on the surface of the semiconductor wafer except for a non-oxidized part of the defect;
    a liquid phase etching for applying liquid containing hydrogen fluoride on the surface of the semiconductor wafer, the liquid phase etching etching the oxide film at a higher etching rate than the defect such that the non-oxidized part of the defect remains to convexly project from the surface of the semiconductor wafer for selectively etching to remove and dissolve the oxide film formed on the surface of the semiconductor wafer; and
    a gas phase etching for applying gas containing hydrogen fluoride on the surface of the semiconductor wafer to etch the non-oxidized part of the defect convexly projected to dissolve and remove the defect.

2. The cleaning method of a semiconductor wafer according to claim 1, wherein the gas phase etching is performed after the oxidation treatment and the liquid phase etching are repeatedly performed.

3. A cleaning method of a semiconductor wafer for removing a convex defect caused by a volume expansion due to an alteration of a crystal structure of a part of the surface of the semiconductor at which a local stress is applied by a foreign substance in a slurry when the surface of the semiconductor wafer is polished with the slurry, the method comprising:
    an oxidation treatment for oxidizing the surface of the semiconductor wafer and the defect using gas containing ozone to form an oxide film and an oxidized defect on the surface of the semiconductor wafer; and
    a gas phase etching for applying gas containing hydrogen fluoride on the surface of the semiconductor wafer to etch the surface of the semiconductor wafer to dissolve and remove the oxide film and the oxidized convexly projecting defect.

4. The cleaning method of a semiconductor wafer according to claim 3, wherein the oxide film is dissolved and removed to leave a predetermined thickness of the oxide film on the semiconductor wafer in the gas phase etching.

5. The cleaning method of a semiconductor wafer according to claim 1, wherein the convex defect is oval in shape.

6. The cleaning method of a semiconductor wafer according to claim 3, wherein the convex defect is oval in shape.

* * * * *